United States Patent
Park

(10) Patent No.: US 8,445,880 B2
(45) Date of Patent: May 21, 2013

(54) PHASE CHANGE MEMORY DEVICE HAVING BIT-LINE DISCHARGE BLOCK AND METHOD OF FABRICATING THE SAME

(75) Inventor: Hae Chan Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 236 days.

(21) Appl. No.: 12/635,920

(22) Filed: Dec. 11, 2009

(65) Prior Publication Data

US 2010/0314598 A1 Dec. 16, 2010

(30) Foreign Application Priority Data

Jun. 10, 2009 (KR) .................. 10-2009-0051488

(51) Int. Cl.
*H01L 29/02* (2006.01)
*H01L 47/00* (2006.01)
*H01L 21/82* (2006.01)

(52) U.S. Cl.
USPC ................... 257/2; 438/128; 365/163

(58) Field of Classification Search
USPC ............... 257/2, 4; 438/128; 365/163, 100, 365/148, 175
See application file for complete search history.

(56) References Cited

U.S. PATENT DOCUMENTS

| 2004/0051094 A1* | 3/2004 | Ooishi .............................. 257/5 |
| 2005/0068830 A1 | 3/2005 | Eaton, Jr. et al. |
| 2006/0284237 A1* | 12/2006 | Park et al. .................... 257/314 |
| 2008/0258129 A1* | 10/2008 | Toda ................................ 257/5 |
| 2008/0280440 A1* | 11/2008 | Chang ........................... 438/684 |
| 2009/0200537 A1* | 8/2009 | Chang et al. ..................... 257/4 |
| 2009/0231899 A1* | 9/2009 | Park ............................... 365/63 |

FOREIGN PATENT DOCUMENTS

| KR | 1020060133740 A | 12/2006 |
| KR | 10-0887069 B1 | 2/2009 |
| KR | 1020090037159 A | 4/2009 |

* cited by examiner

*Primary Examiner* — Asok K Sarkar
*Assistant Examiner* — Dmitriy Yemelyanov
(74) *Attorney, Agent, or Firm* — Ladas & Parry LLP

(57) ABSTRACT

A phase change memory device capable of fully discharging bit lines, even while occupying a relatively small area, and a fabricating method thereof are presented. The phase change memory device includes a semiconductor substrate, a word line area, a discharge line area, a switching PN diode, a dummy PN diode, a phase change structure, and a bit line. The word line area is formed in a memory cell area of the semiconductor substrate. The discharge line area is formed in the bit-line discharge area of the semiconductor substrate. The switching PN diode is formed on the word line area. The dummy PN diode is formed on the discharge line area. The phase change structure is formed on the switching PN diode and is electrically connected to the switching diode. The bit line is electrically connected to the phase change structure and the dummy PN diode.

20 Claims, 6 Drawing Sheets

PHASE CHANGE MEMORY DEVICE HAVING BIT-LINE DISCHARGE BLOCK AND METHOD OF FABRICATING THE SAME

CROSS-REFERENCE TO RELATED APPLICATIONS

The present application claims priority under 35 U.S.C 119(a) to Korean Application No. 10-2009-0051488, filed on Jun. 10, 2009, in the Korean Intellectual Property Office, which is incorporated herein by reference in its entirety as set forth in full.

BACKGROUND

1. Technical Field

Exemplary embodiments disclosed herein relate to phase change memory devices, and more particularly, to a phase change memory (PRAM) device having a bit-line discharge block.

2. Related Art

Semiconductor memory devices are generally classified into volatile and nonvolatile types. Typically volatile memory devices are random access memories (RAMs) that lose their data when power is interrupted. Typically nonvolatile memory devices are read-only memories (ROMs) that are capable of retaining their data even when power is interrupted. Some typical RAMs include dynamic and static RAMs, while some typical ROMs include flash memories.

The dynamic RAM (DRAM) devices typically enjoy low power consumption and random access advantages, but suffer by being volatile as well as suffer by having relatively large increases in the volume of cell capacitors due to the demands for larger data capacities. The static RAM (SRAM) devices usually employed as caches in systems can realize the advantages of speed as well as convenience due to random access. However SRAM devices also suffer by being volatile and suffer by being relatively more expensive per bit due to their relatively large cell sizes. In contrast flash memories are nonvolatile but they suffer from requiring operation voltages higher than power source voltages because two gates (e.g., control and floating gates) are stacked in each cell structure. As a result flash memories additionally require voltage boosting circuits for supplying high voltages to memory cells in the writing and erasing modes. For these and other reasons flash memories are not easy modify in order to improve higher integration densities and to enhance their relatively slower operation rates.

In consideration of the above structural and functional limitations of the semiconductor memories, there have been a number of different proposed alternate memory configurations that include ferroelectric RAMs (FRAMs), magnetic RAMs (MRAMs) and phase change RAMs (i.e., PRAMs).

The PRAM devices typically include a phase change transition material that exhibits a relatively high resistance when in a disordered amorphous state and exhibits a relatively low resistance when in a more ordered crystalline state. Information can be stored in PRAMs by writing and reading the corresponding resistance across the phase change material. The PRAM is regarded as more advantageous than the flash memory in promising to realize higher operation rates and higher integration densities.

A PRAM memory cell may be formed of a switching element coupled to a word line, a page changeable material heating up/down by an on/off condition of the switching element, and a bit line transferring data into/from the phase change material.

A writing operation of the PRAM is accomplished by applying a current to the phase change material of a selected memory cell through a corresponding bit line that reversibly drives the phase change material into either the amorphous or crystalline solid states. A writing data of "0" (set) or "1" (reset) can be arbitrarily assigned to anyone of the particular solid states of the phase change material.

Data from the PRAM can be read by correlating the resistivity across of the particular solid state phase of the phase change material. When only two major solid state phases occur between each other in a given phase change material, then logical values of data can be arbitrarily assigned as either "0" or "1" depending upon the measured resistance subsequent to a writing operation.

The PRAM devices usually employ a bit-line discharge switch at an end of each bit line for correctly reading and writing data. The bit-line discharge circuit generally includes a MOS transistor that functions to preliminarily exhaust charges out of the bit line.

To increase of integration density on the PRAM in recent years, a vertical PN diode has been used to replace the MOS transistor of a cell switching element to realize a smaller occupation area of each PRAM cell. Thus, owing to a burden of building a MOS transistor region in a cell array field for the conventional bit-line discharge switch formed of the MOS transistor, there is a problem of enlarging a layout size on the PRAM.

Considering the area burden relevant to the structure of bit-line discharge switch, Korean Patent No. 0887069 discloses that the bit-line discharge switch is formed of a dummy cell in the same pattern with a PRAM cell.

As illustrated in FIG. 1, dummy cells 20 are each coupled to ends of bit lines BL1~BL4. Each dummy cell is composed of a switching diode D and a variable resistor Rv made of a phase change maternal, as like the structure of PRAM cells 10 arranged at intersections of word lines WL1~WL4 and the bit lines BL1~BL4.

With the dummy cells 20, when a bit-line discharge signal BLDIS is activated in a low level, a ground voltage is transferred to the bit lines BL1~BL4 by way of the switching diode D and the variable resistor Rv. Then, the bit lines BL1~BL4 are discharged to the ground voltage.

This structure as shown in FIG. 1 may be regarded as helpful in reducing a size of the PRAM layout by building the bit-line discharge switch in the same structure with the PRAM cell 10 because there is no need to prepare a MOS transistor region in a cell array field as well as no need to prepare an additional circuit for extending discharge paths of the bit lines.

However, in the discharge switch of the dummy cell 20 much like in the PRAM cell 10, the variable resistor Rv of the dummy cell 20 is composed of a phase change material. As a result the variable resistor can inadvertently change phases be changed in response to a pulse of the bit-line discharge signal BLDIS even at low heat conditions.

Such an inadvertent phase change of the variable resistor Rv of the dummy cell 20 would cause an unwanted discharge failure to a corresponding bit line and further incur an error of reset data from the PRAM cells 10 coupled to the corresponding bit line, resulting in a column fail.

SUMMARY

Exemplary embodiments provide a PRAM device efficient in discharging bit lines without inadvertent resistive variation, and a method of economically fabricating the same.

In an embodiment, a phase change memory device may include: a bit line coupled to a plurality of phase change memory cells each of which has a switching PN diode and a variable resistor; and a dummy PN diode coupled to the bit line and discharging the bit line in response to a bit-line discharge signal. The dummy PN diode may be directly coupled to the bit line.

In another embodiment, a phase change memory device may include: a cell array having a plurality of word lines, a plurality of bit lines intersecting the word lines, and a plurality of memory cells arranged at intersections of the word and bit lines; and a bit-line discharge block having dummy cells coupled to the bit lines. Each dummy cell may include a dummy PN diode directly coupled to the bit line.

In another embodiment, a phase change memory device may include: a semiconductor substrate in which a memory cell area and a bit-line discharge area are defined; a word line area formed in the memory cell area of the semiconductor substrate; a discharge line area formed in the bit-line discharge area of the semiconductor substrate; a switching PN diode formed on the word line area; a dummy PN diode formed on the discharge line area; a phase change structure formed on the switching PN diode and electrically connected to the switching diode; and a bit line electrically connected to the phase change structure and the dummy PN diode.

In another embodiment, a phase change memory device may include: a semiconductor substrate in which a memory cell area and a bit-line discharge area are defined; a plurality of word line areas disposed with an interval in the memory cell area of the semiconductor substrate; a discharge line area formed parallel with the word line area in the bit-line discharge area; a plurality of switching PN diodes disposed in an interval respectively on the word line areas; a plurality of dummy PN diodes disposed on the discharge line area; a phase change structure formed on the switching PN diode and electrically connected to the switching PN diode; a plurality of bit lines extending in a direction rectangular to the word line area and the discharge line area on the phase change structure and electrically connected to the phase change structure and the dummy PN diodes; a plurality of metallic word lines formed respective to the word line areas on the bit lines and electrically connected respectively to the word line areas; and a metallic discharge line formed corresponding to the discharge line area on the bit line and electrically connected to the discharge line area.

According to another embodiment, a method of fabricating a phase change memory device may be comprised of: preparing a semiconductor substrate in which a memory cell area and a bit-line discharge area are defined; forming a word line area and a discharge line area in the memory cell area and the bit-line discharge area; forming a switching PN diode and a dummy PN diode on the word line area and the discharge line area; forming a heat electrode on the switching PN diode; forming a phase change structure on the heat electrode; forming a bit line to contact with the phase change structure and the dummy PN diode; and forming a metallic word line and a metallic discharge line, on the bit line, to be electrically connected with the word line area and the discharge line area.

A further understanding of the nature and advantages of the present invention herein may be realized by reference to the remaining portions of the specification and the attached drawings.

BRIEF DESCRIPTION OF THE DRAWINGS

Non-limiting and non-exhaustive embodiments of the present invention will be described with reference to the following figures, wherein like reference numerals refer to like parts throughout the various figures unless otherwise specified. It is also understood herein that the drawings are not necessarily to scale and in some instances proportions may have been exaggerated in order to more clearly depict certain features of the invention. In the figures.

DESCRIPTION OF EMBODIMENTS

Various exemplary embodiments will now be described more fully with reference to the accompanying drawings in which some exemplary embodiments are shown. However, specific structural and functional details disclosed herein are merely representative for purposes of describing exemplary embodiments. Like numbers refer to like elements throughout the description of the figures.

Further, it will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the invention. As used herein, the term "and/or" includes any and all combinations of one or more of the associated listed items. Also will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

In order to more specifically describe exemplary embodiments, various aspects will be hereinafter described in detail with reference to the attached drawings.

Figure 1:
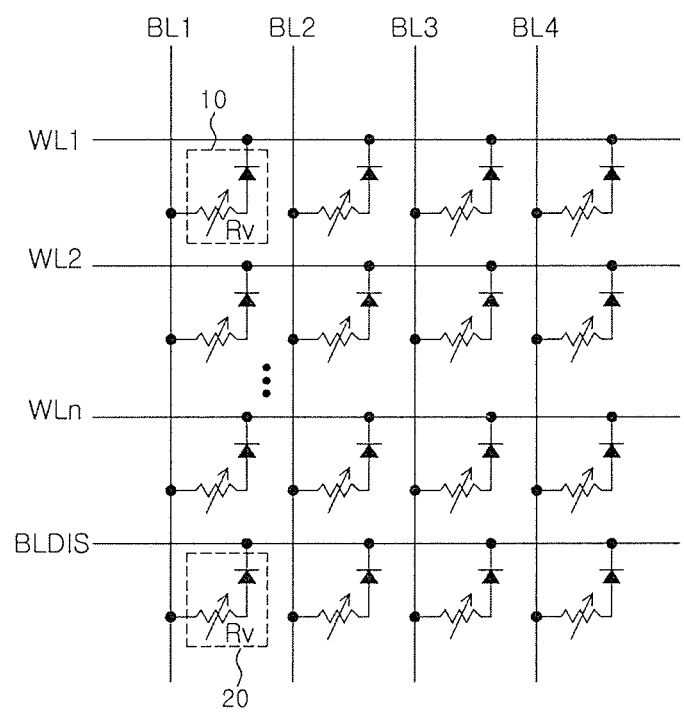
FIG. 1 is a circuit diagram of a general PRAM device.
Figure 2:
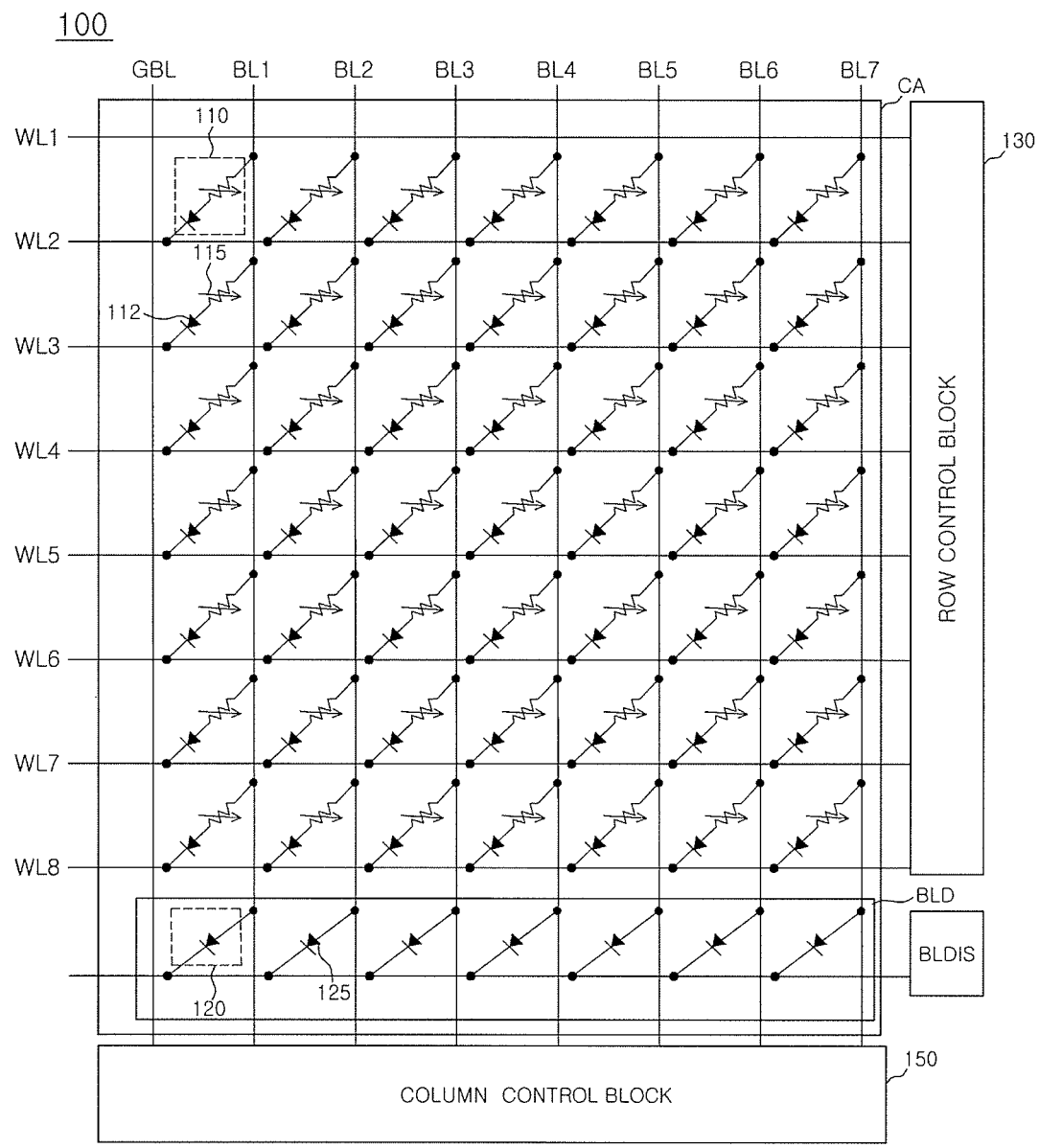
FIG. 2 is a circuit diagram of a PRAM device according to an embodiment.

FIG. 2 illustrates a circuit of a PRAM according to an embodiment of the present invention.

Referring to FIG. 2, the PRAM device 100 may include a plurality of cell arrays CA. FIG. 2 exemplarily shows a single one of the cell arrays CA. The cell array CA is exemplarily formed by arranging 8 word lines and 8 bit lines thereon.

The cell array CA includes a plurality of unit cells 110. The unit cells 110 are defined by pluralities of word lines WL1~WL8 and bit lines GBL, BL1~BL7 in locations, being each arranged at intersections of the word and bit lines WL1~WL8 and GBL, BL1~BL7. Each unit cell may be composed of a switching diode 112 coupled to the word line (e.g., WL3), and a variable resistor 115 coupled to the bit line (e.g., BL1) and having a variable resistance in response to an on/off operation of the switching diode 112. The switching diode 112 can be replaced with a metal-oxide-silicon (MOS) or a bipolar transistor capable of switching, but a vertical PN diode may be advantageous in minimizing the area. Further, the variable resistor 115 may be formed of a phase change material containing germanium (Ge), antimony (Sb) and tellurium (Te).

The word lines WL1~WL8 are controlled by a row control block 130 and the bit lines GBL, BL1~BL7 are controlled by a column control block 150.

The row control block 130 may be disposed at a side of the cell array CA in the extending direction of the word lines WL1~WL8. The row control block 130 may include a local X-switch (not shown) for selecting one of the word lines WL1~WL8.

The column control block 150 may be disposed at a side of the cell array CA in the extending direction of the bit lines GBL, BL1~BL7. The column control block 150 may include a local Y-switch (not shown) for selectively connecting the bit lines GBL, BL1~BL7 to a global bit line GBL.

The cell array CA includes a bit-line discharge block BLD for releasing charges from the bit lines GBL, BL1~BL7 before the reading or writing operation of the PRAM. The bit-line discharge block BLD may be placed at an end of the bit lines GBL, BL1~BL7, e.g., on the edge of the cell array CA, facing the column control block 150. Disposing the bit-line discharge block BLD adjacent to the column control block 150 contributes to reducing delay of a control signal from the column control block 150 and makes the control signal easy to access thereto.

The bit-line discharge block BLD may be formed of plural dummy cells 120 corresponding to the bit lines GBL, BL1~BL7.

The dummy cell 120 may be formed of a dummy diode 125 coupled between the bit-line discharge line BLDIS and the bit line (e.g., BL1). The plural dummy cells 120 are controlled by a signal applied by way of the bit-line discharge line BLDIS. As can be seen from the stated above, it is possible to fabricate the dummy diode 125 at the same time with the switching diode 112 of the memory cell 110.

Since the dummy cells 120 are simply formed of the dummy diodes 125 and function as switches responding to the signal of the bit-line discharge line BLDIS (hereinafter, referred to as "bit-line discharge signal"), they can fully discharge the bit lines GBL, BL1~BL7. In other words, as the dummy diodes 125 directly contact with the bit lines GBL, BL1~BL7 without connection through the variable resistors, different from the memory cell 110, it is able to make the bit lines GBL, BL1~BL7 from a discharge failure that has been caused by unstable phase changes from the variable resistors of the conventional dummy cells when the bit-line discharge signal is activated.

Figure 3:
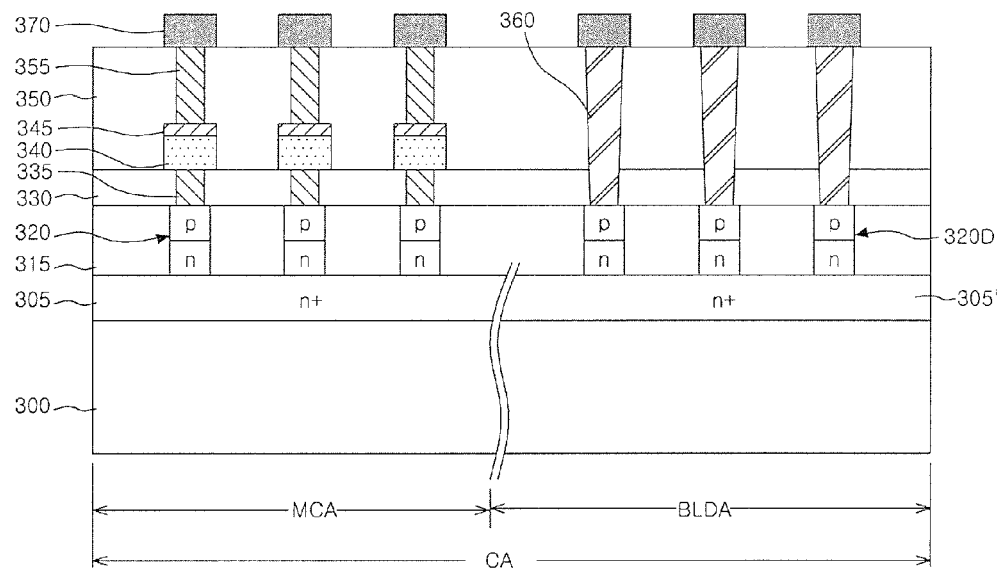
FIG. 3 is a sectional diagram of a PRAM device according to an embodiment.

FIG. 3 shows a section of a PRAM device according to an embodiment, partly illustrating a memory cell area MCA of the cell array CA and the bit-line discharge block BLD of FIG. 2.

Referring to FIG. 3, the PRAM device is formed on a semiconductor substrate 300 divided into the memory cell area MCA in which the memory cells 110 are to be disposed, and a bit-line discharge area BLDA in which the dummy cells 120 are to be disposed. The semiconductor substrate 300 may be a silicon substrate containing P-type impurities, or a silicon substrate including a P-type well. Otherwise, the semiconductor substrate 300 may comprise a silicon-on-insulator (SOI) substrate instead of the silicon substrate.

In the memory cell area MCA of the semiconductor substrate 300 is formed an N-type junction region 305 acting as the word line. On the N-type junction region 305 are formed a plurality of switching PN diodes 320. Here, the plural PN diodes 320 are configured in vertical forms and electrically isolated each other by way of a first interlayer insulation film 315.

On each of the PN diodes 320 are formed heat electrodes 335. On the heat electrodes 335, phase change patterns 340 and top electrodes 345 are sequentially stacked to form phase change structures. The heat electrodes 335 are electrically isolated from each other by way of a second interlayer insulation film 330. The heat electrodes 335 may be made of a conductor having high resistivity to achieve a low reset current by high efficiency of heat generation, and/or may be shaped in various forms to reduce contact areas with the phase change patterns 340.

On the phase change patterns, i.e., on the top electrodes 345, bit lines 370 are formed that electrically contact with the respective phase change structures underneath the bit lines 370. The top electrodes 345 are electrically connected to the bit lines 370 by way of top electrode contacts 355. Here, the stacked structures, each of which is composed of the phase change pattern 340, the top electrode 345 and the top electrode contact 355, are electrically isolated each other by way of a third interlayer insulation film 350 adjacent thereto.

On the other side, an N-type junction region 305' is formed in the bit-line discharge area BLDA of the semiconductor substrate 300. The N-type junction region 305' of the bit-line discharge area BLDA may be formed in the same or similar pattern by the same or similar processing step with the junction region 305 of the memory cell area MCA. The junction region 305' acts as a signal transmission region (hereinafter, referred to as "discharge line region") for discharging the bit lines, independent from the junction region 305 acting as a word line region.

On the junction region 305' of the bit-line discharge area BLDA are formed dummy PN diodes 320D. The dummy PN diodes 320D are formed in the same or similar pattern by the same or similar processing step with the switching PN diodes of the memory cell area MCA.

As indicated in FIGS. 2 and 3, the junction region 305 acting as the word line region and the junction region 305' of the bit-line discharge area BLDA are linear on plane and parallel each other. The switching and dummy PN diodes, 320 and 320D, may be correspondingly arranged each other along the same column. Here, "column" may mean "bit line region".

As the switching and dummy PN diodes, 320 and 320D, are formed on the junction regions 305 and 305', they are shaped in silicon-based Schottky diodes made of single crystalline silicon layer.

Over the dummy PN diodes 320D are formed bit lines 370. The bit lines 370 of the bit-line discharge area BLDA and the memory cell area MCA may be disposed on the same level.

While FIG. 3 illustrates that the memory cell area MCA and the bit-line discharge area BLDA are independently divided from each other, the bit lines 370 coupled to the phase change structure and the dummy PN diode 320D may be a single line without any disconnection between them.

The dummy PN diodes 320D of the bit-line discharge area BLDA directly contact with their respective corresponding bit lines 370 by way of second conductive plugs 360. In this manner, without the phase change structures being sensitive to current, the dummy PN diodes 320D of the bit-line discharge area BLDA substantially conduct the switching functions for discharging the bit lines. The second conductive plugs 360 are electrically isolated from each other by way of the second and third interlayer insulation films 330 and 350. The second conductive plugs 360 may be formed of doped polycrystalline silicon or a metal having a superior interlayer filling quality.

In this embodiment, since the dummy PN diodes 320D of the bit-line discharge area BLDA directly contact to the bit lines 370 by way of the second conductive plugs 360, without interposing the phase change patterns 340 therebetween, it is possible to substantially prevent a bit-line discharge failure brought about by unwanted crystalline variations of the phase change patterns 340.

Figure 4:
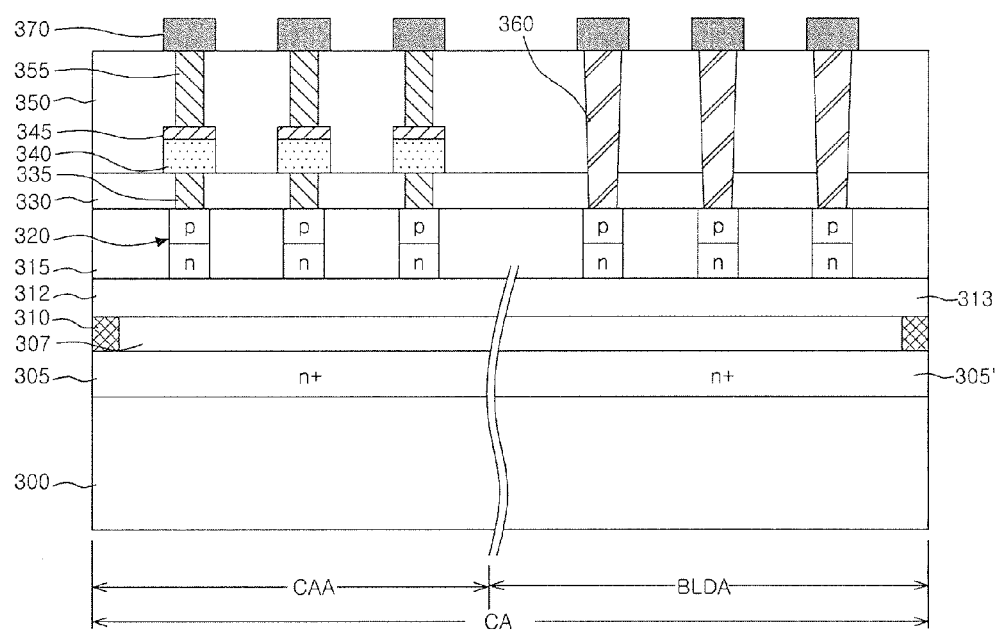
FIG. 4 is a sectional diagram of a PRAM device according to another embodiment.

Additionally, referring to FIG. 4, it is permissible to interpose metal line layers 312 and 313 between the N-type junction regions 305 and 305' and the PN diodes 320 and 320D. That is, the switching and dummy PN diodes, 320 and 320D can be formed on the metal line layers 312 and 313. The metal line layers 312 and 313 may be made of a metal having a superior heatproof quality. The metal line layers 312 and 313 are electrically connected to the N-type junction regions 305 and 305' by way of contact plugs 310. In this case, the switching and dummy PN diodes, 320 and 320D, are made of polycrystalline silicon because they are disabled for single crystal growth on the metal line layers 312 and 313. Therefore, if the metal line layers 312 and 313 are provided, then the metal lines layers 312 and 313 respectfully function as a word line area in the memory cell area MCA and as a discharge line area in the bit-line discharge area BLDA. Further, the switching and dummy PN diodes, 320 and 320D, are arranged in a form of Schottky diodes. The metal line layers 312 and 313 may be buffer metal lines provided to reduce resistance of the N-type junction regions 305 and 305'. It is also permissible to interpose a conductive film between the N-type junction regions 305 and 305' and that of the metal lines layers 312 and 313.

Now, a method for fabricating the aforementioned structure of the PRAM device according to exemplary embodiments, especially in regard to the bit-line discharge area BLDA, will be described hereinafter in conjunction with FIGS. 5 through 8.

Figure 5:
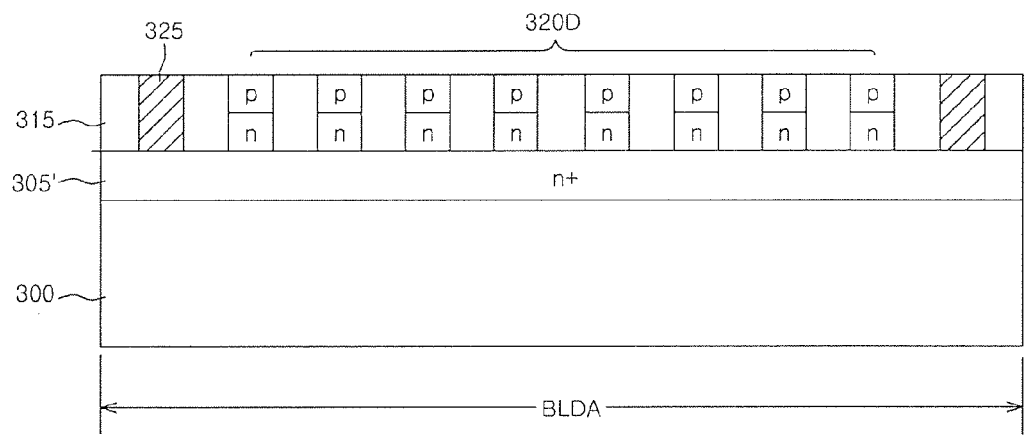
FIGS. 5 through 8 are sectional diagrams showing a fabricating method of a PRAM device by another embodiment.

Referring to FIGS. 3 and 5, there is first prepared the semiconductor substrate 300 in which the memory cell area MCA (not shown in FIG. 5) and the bit-line discharge area BLDA are defined. The semiconductor substrate 300 may be a silicon substrate containing P-type impurities or a silicon substrate having a P-well. N-type impurities are implanted into the semiconductor substrate 300 to form the N-type junction regions 305 and 305' respectively for the word lines of the memory cell area MCA and the bit-line discharge area BLDA.

Next, the first interlayer insulation film 315 is deposited on the semiconductor substrate 300 in which the N-type junction region 305 and 305' are formed. The first interlayer insulation film 315 is selectively etched away to partly expose the N-type junction region 305' to form a plurality of contact holes (not shown). Then, the dummy PN diodes 320D are formed within the contact holes. Although not shown in FIG. 5, the dummy PN diodes 320D are formed by the same processing steps as those formed in the switching PN diodes 320 arranged in the memory cell area MCA. That is, the switching and dummy PN diodes, 320 and 320D, are fabricated by the sequential processing steps of growing an epitaxial layer in the contact holes, flattening the epitaxial layer to fully fill in the contact holes, implanting N-type impurities into the epitaxial layer, and implanting P-type impurities into the top of the epitaxial layer. The epitaxial layer may be a single crystalline silicon layer growing up from the junction region 305' as a base.

Afterward, other contact holes (not shown) are formed in the first interlayer insulation film 315 at one or both sides of the dummy PN diodes 320D and first conductive plugs 325 are subsequently formed within these other contact holes by way of a common process. The first conductive plugs 325 may be disposed at one or both edges of the junction regions 305 and 305' along a lengthwise direction. The first conductive plugs 325 act as wiring routes for electrically connecting the N-type junction region 305' with metallic discharge lines that will be formed later. The first conductive plugs 325 may be made up of doped polycrystalline silicon, doped single crystalline silicon or metal.

While this embodiment shows the case that the first conductive plugs 325 is formed after completing the dummy PN diodes 320D, the first conductive plugs 325 may be formed before completing the dummy PN diodes 320D or made of the same base material with the dummy PN diodes 320D by controlling an ion implantation process therein.

Figure 6:
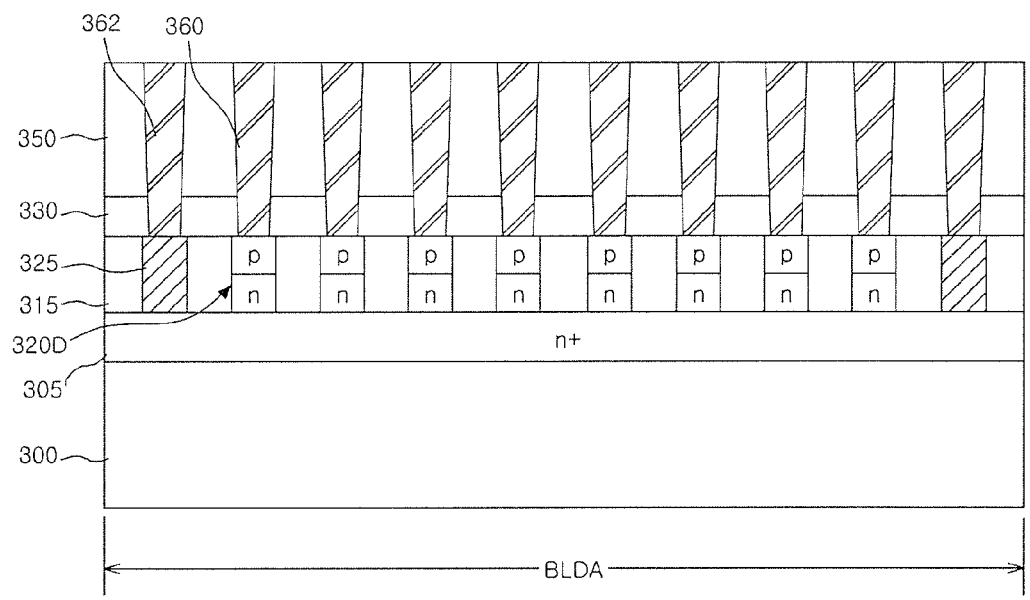

Now referring to FIGS. 3 and 6, the second interlayer insulation film 330 is deposited on the structure including the first conductive plugs 325 and the dummy PN diodes 320D. Next, the second interlayer insulation film 330 of the memory cell area MCA is selectively etched away to expose the switching PN diodes 320 of the memory cell area MCA, forming heat-electrode contact holes (not shown). The heat-electrode contact holes are subsequently filled in with a high resistivity material to complete the heat electrodes 335. During this, the dummy PN diodes 320D of the bit-line discharge area BLDA are preferably covered by the second interlayer insulation film 330.

Continuously, in the memory cell area MCA, after sequentially depositing a phase change film and a top-electrode conductive layer on the second interlayer insulation film 330, then the top-electrode conductive layer and the phase change film are selectively etched away to define the phase change patterns 340 and the top electrodes 345 on the heat electrodes 335. Thereafter, the third interlayer insulation film 350 is deposited on this resultant structure. During this, on the dummy PN diodes 320D of the bit-line discharge area BLDA, the second and third interlayer insulation films, 330 and 350, are formed in sequence. Next, the third interlayer insulation film 350 is selectively etched away to expose the top electrodes 345, forming top-electrode contact holes (not shown). The top-electrode contact holes are subsequently filled in with the top electrode contacts 355 by way of any number of commonly known processes.

On the other hand, in the bit-line discharge area BLDA, the third and second interlayer insulation films 350 and 330 are selectively etched away to expose the tops of the dummy PN diodes 320D and the first conductive plugs 325, forming via holes (not shown). Then, these via holes are subsequently filled in with a conductive material to form the second conductive plugs 360 and 362. In this structure, since these via holes are formed to penetrate the second and third interlayer insulation films 330 and 350, then their respective aspect ratios are relatively very large. Thus, a conductive material forming the second conductive plugs 360 and 362 is preferably selected from metals that exhibit superior filling quality capacities, e.g., tungsten, and/or doped polycrystalline silicon. If the second conductive plugs 360 and 362 are formed of a metal on the switching PN diodes 320, then the dummy PN diodes 320D and the first conductive plugs 325 are formed of a silicon-contained material. Ohmic contact layers may be selectively provided onto the top surfaces of the switching PN diodes 320, the dummy PN diodes 320D and the first conductive plugs 325.

While this embodiment is illustrated as the top electrode contacts 355 and second conductive plugs 360 and 362 are independently formed by different processing steps, it is permissible to coincidently form them in the same processing step by adjusting targets for etching the via holes and the top-electrode contact holes.

Figure 7:
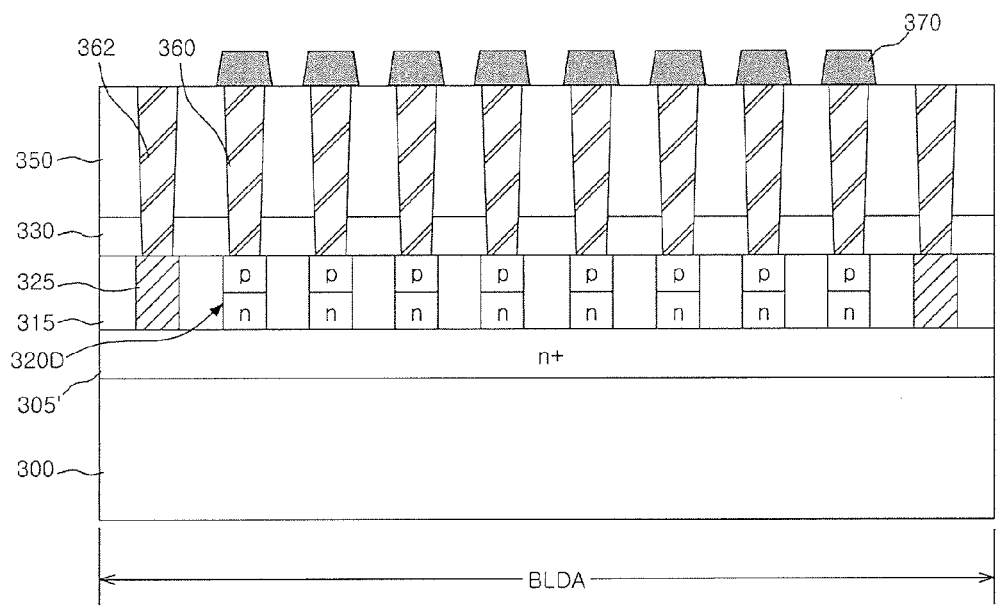

Next, referring to FIGS. 3 and 7, after depositing a bit-line metal film (not shown) on the third interlayer insulation film 350 in a predetermined thickness, the bit lines 370 are formed by is subsequently patterned the bit-line metal film to meet the top electrode contacts 255 and the second conductive plugs 360 that are electrically connected to the switching PN diodes 320 and to the dummy PN diodes 320D.

Figure 8:
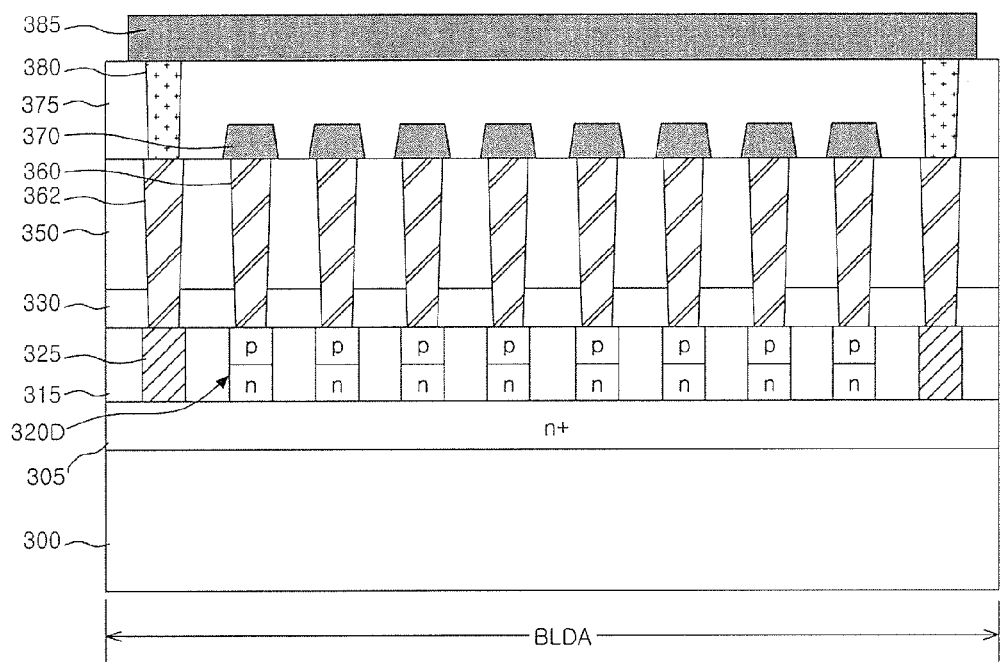

Afterward, referring to FIGS. 3 and 8, a fourth interlayer insulation film 375 is deposited on the third interlayer insulation film 350 on which the bit lines 370 are arranged. Then, third conductive plugs 380 are formed in the fourth interlayer insulation film 375, contacting with the second conductive plugs 362 that are electrically connected to the N-type junction regions 305 and 305'. Next, metal lines 385 are formed on the fourth interlayer insulation film 375, contacting with the third conductive plugs 380. The metal lines 385 are respectively disposed in the memory cell area MCA and the bit-line discharge area BLDA. The metal lines 385 are used as metallic word lines in the memory cell area MCA, while used as metallic discharge lines in the bit-line discharge area BLDA.

In this embodiment, the conductive plugs for directly coupling the dummy PN diodes 320D with the bit lines 370 are formed at the same time of forming the conductive plugs for electrically connecting the metallic word lines or the metallic discharge lines with the junction regions 305 and 305'. Therefore, it is possible to directly coupling the bit lines 370 with the dummy PN diodes 320D that are used in discharging the bit lines, by way of any number of general well known and available fabrication techniques for the PRAM device, without an additional processing step.

Figure 9:
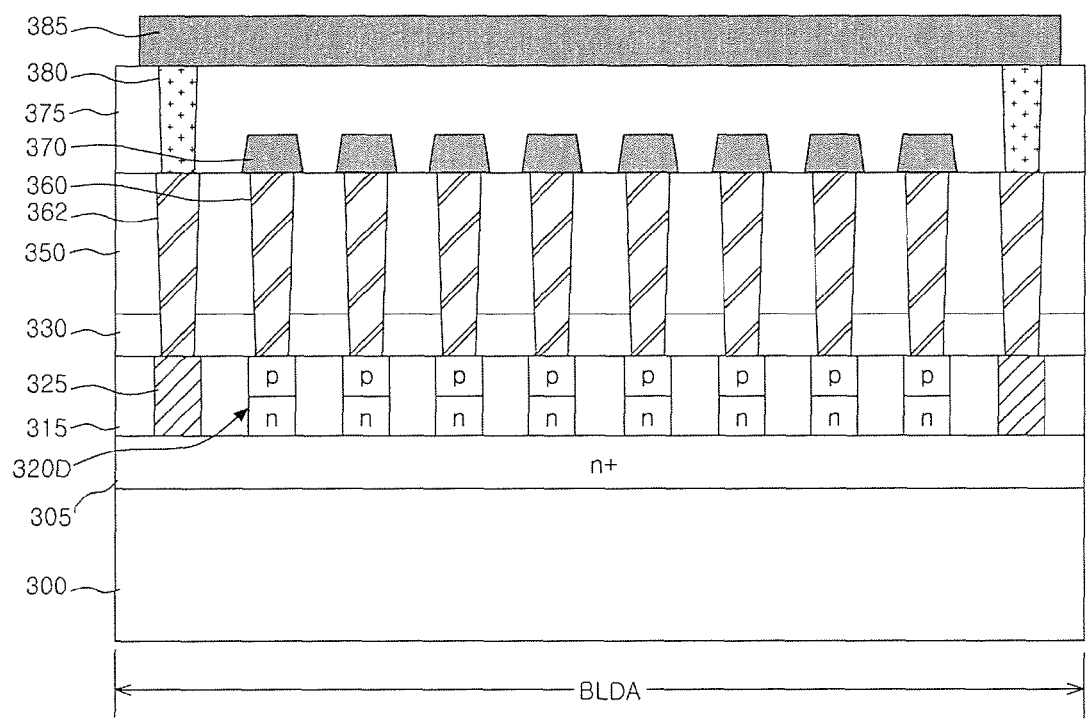
FIG. 9 is a sectional diagram showing a fabricating method of a PRAM device by another embodiment.

Now referring to FIGS. 4 and 9, the metal line layers 312 and 313 may be interposed between the junction region 305 and the metal line 385. This structure can be achieved by the steps of: forming an additional insulation film; selectively forming the contact plugs 310 in the insulation film; and forming the metal line layers 312 and 313 to connect with the contact plugs 310, after forming the N-type junction region 305 and before depositing the first interlayer insulation film 315. These metal line layers 312 and 313 are provided to reduce resistance of the word lines.

According to the exemplary embodiments of the present invention, the unit circuits of the bit-line discharge block BLD (corresponding to the bit-line discharge area BLDA) in the PRAM device are formed as dummies by the same fabrication process with memory cells. That is, the bit-line discharge block is only composed of the dummy PN diodes 125 (or 320D) without variable resistors (phase change material). Therefore, a switching error due to inadvertent resistance variation can be substantially prevented while discharging the bit lines. As a result, the bit lines can be substantially successfully discharged without failure. Further, the direct contact between the bit lines and the dummy PN diodes is helpful in reducing wiring resistance and hence improves signal transmission characteristics of the PRAM device.

Even without considering the merit of excluding the variable resistors, it is substantially possible to reduce switching errors through the bit-line discharge block, without an additional processing step, because a traditional metal-word line contacting process can be used for directly contacting the dummy PN diodes with the bit lines.

While the storage medium of the PRAM device is referred to as "phase change pattern" or "variable resistor" in the above description for the exemplary embodiments, these terms are exemplarily different terms to the same material. But, the storage medium may be also called "variable capacitor", not restrictive to the aforementioned usage.

Additionally, the term "directly contact", "directly coupled" or "directly connected" includes the meaning of interactive conduction between elements or media through a wiring member such as plug, via contact or stud, as well as direct contact between them.

The foregoing is illustrative of exemplary embodiments and is not to be construed as limiting thereof. Although a few exemplary embodiments have been described, those skilled in the art will readily appreciate that many modifications are possible in exemplary embodiments without materially departing from the novel teachings and advantages. Accordingly, all such modifications are intended to be included within the scope of this invention as defined in the claims.

What is claimed is:

1. A phase change memory device, comprising:
   a semiconductor substrate in which a memory cell area and a bit-line discharge area are defined;
   a word line area formed in the memory cell area of the semiconductor substrate;
   a discharge line area formed in the bit-line discharge area of the semiconductor substrate;
   a switching PN diode formed on the word line area;
   a dummy PN diode formed on the discharge line area;
   a phase change structure formed on the switching PN diode and electrically connected to the switching diode; and
   a bit line formed on the phase change structure and the dummy PN diode,
   wherein the bit line which is formed on the memory cell area is electrically connected to the phase change structure, and the bit line which is formed on the bit line discharge area is connected to the dummy PN diode using a plug, and
   wherein the plug is configured to have direct physical contact with the dummy PN diode.

2. The phase change memory device according to claim 1, further comprises:
   a metallic word line electrically connected to the word line area; and
   a metallic discharge line electrically connected to the discharge line area wherein the metallic word line and the metallic discharge line are over the bit line.

3. The phase change memory device according to claim 2, further comprises a plurality of stacked plugs electrically connecting the word line area to the metallic word line and electrically connecting the discharge line area to the metallic discharge line.

4. The phase change memory device according to claim 3, wherein the stacked plugs comprises:
   a first conductive plug electrically coupled to the word line area or the discharge line area;
   a second conductive plug electrically coupled to the first conductive plug; and
   a third conductive plug electrically coupled to the second conductive plug and electrically coupled to the metallic word line or the metallic discharge line.

5. The phase change memory device according to claim 4, wherein the stacked plugs are disposed at one or both ends of the word line area and the discharge line area.

6. The phase change memory device according to claim 4, wherein the plug is simultaneously formed with the second conductive plug.

7. The phase change memory device according to claim 1, wherein the phase change structure comprises:
   a phase change pattern electrically connected to the switching PN diode; and
   a top electrode formed on the phase change pattern.

8. The phase change memory device according to claim 7, further comprises a heat electrode interposed between the switching PN diode and the phase change pattern.

9. The phase change memory device according to claim 1, wherein at least one of the word line area and the discharge line area further includes a metal line layer, and the metal line area is electrically connected to a junction region formed in the semiconductor substrate.

10. A phase change memory device, comprising:
    a semiconductor substrate in which a memory cell area and a bit-line discharge area are defined;
    a plurality of word line areas disposed in the memory cell area of the semiconductor substrate;
    a discharge line area formed in the bit-line discharge area such that the discharge line area is substantially in parallel with the word line areas;
    a plurality of switching PN diodes disposed on the word line areas;
    a plurality of dummy PN diodes disposed on the discharge line area;
    a plurality of phase change structures formed on and electrically connected to the switching PN diodes;
    a plurality of bit lines electrically connected to the phase change structures and the dummy PN diodes;
    a plurality of metallic word lines formed on the bit lines and electrically connected respectively to the word line areas; and
    a metallic discharge line formed on the bit lines and electrically connected to the discharge line area,
    and wherein the bit lines which are formed in the bit line discharge area is connected to the dummy PN diode using a plug, and wherein the plug is configured to have direct physical contact with the dummy PN diode.

11. A method of fabricating a phase change memory device, the method comprising:
    preparing a semiconductor substrate in which a memory cell area and a bit-line discharge area are defined;
    forming respectively a word line area and a discharge line area in the memory cell area and the bit-line discharge area;
    forming respectively a switching PN diode and a dummy PN diode on the word line area and the discharge line area;
    forming a heat electrode on the switching PN diode;
    forming a phase change structure on the heat electrode;
    forming a bit line that electrically contacts to the phase change structure and the dummy PN diode; and
    forming respectively a metallic word line and a metallic discharge line that respectively electrically connects to the word line area and the discharge line area,
    wherein a first portion of the bit line which is formed on the memory cell area is electrically connected to the phase change structure and a second portion of the bit lines which is formed on the bit line discharge area is connected to the dummy PN diode using a plug, and wherein the plug being in direct physical contact with the dummy PN diode.

12. The method according to claim 11, wherein forming respective the word line area and the discharge line area comprises: forming a junction region by implanting impurities into the semiconductor substrate in the word line area and the discharge line area.

13. The method according to claim 12, wherein forming respectively the switching and dummy PN diodes comprises:
    forming a first interlayer insulation film on the junction region of the semiconductor substrate;
    forming diode contact holes by selectively etching through the first interlayer insulation film to partly expose the junction region;
    forming a silicon layer onto the first interlayer insulation film to fill in the diode contact holes;
    implanting N-type impurities into the silicon layer; and
    implanting P-type impurities into the silicon layer.

14. The method according to claim 11, wherein forming respectively the word line area and the discharge line area comprises:
    forming a junction region by implanting impurities into the memory cell area and the bit-line discharge area;
    forming an insulation film on the junction region; and
    forming a metal line layer on the insulation film that electrically contacts to the junction region.

15. The method according to claim 14, wherein the step of forming respectively the switching and dummy PN diodes comprises:
    forming a first interlayer insulation film on the metal line layer;
    forming diode contact holes by selectively etching through portions of the first interlayer insulation film to partly expose the metal line layer;
    filling in the diode contact holes with a silicon film;
    implanting N-type impurities into the silicon film; and
    implanting P-type impurities into the silicon film.

16. The method according to claim 11, wherein the step of forming the heat electrode comprises:
    forming a second interlayer insulation film on the switching and dummy PN diodes;
    forming a contact hole to expose a portion of the switching PN diode by selectively etching through a portion of the second interlayer insulation film; and
    filling in the contact hole with a conductive material.

17. The method according to claim 16, wherein the step of forming the phase change structure comprises:
    forming a phase change material film on the second interlayer insulation film;
    forming a top-electrode conductive layer on the phase change material film; and
    patterning the top-electrode conductive layer and the phase change material film thereby forming a top-electrode and the phase change structure.

18. The method according to claim 11, further comprising:
    forming a third interlayer insulation film on the phase change structure;
    forming plugs within the third interlayer insulation film that electrically connected to the phase change structure and the dummy PN diode; and
    forming bit lines on the third interlayer insulation film that electrically contact to the plugs.

19. The method according to claim 11, further comprising:
    forming first conductive plugs that electrically contact to the word line area and the discharge line area, wherein the forming first conductive plugs step is performed after forming the word line area and the discharge line area and before forming the switching and dummy PN diodes, or after forming the switching and dummy PN diodes and before forming the heat electrode; and forming second conductive plugs that electrically contacts to the first conductive plugs, wherein the step of forming a second conductive plugs is performed after forming the phase change structure and before forming the bit lines.

20. The method according to claim 19, wherein the step of forming respectively the metallic word line and the metallic discharge line comprises:

forming the third interlayer insulation film on the bit line;

forming a third conductive plug within the third interlayer insulation film that electrically contacts to the second conductive plug; and forming a metal line that electrically contacts to the third conductive plug.

\* \* \* \* \*